United States Patent
Bae (10) Patent No.: US 11,232,818 B2
(45) Date of Patent: Jan. 25, 2022

(54) MEMORY SYSTEM PERFORMING REFERENCE VOLTAGE TRAINING OPERATION AND OPERATING METHOD OF MEMORY SYSTEM

(71) Applicant: SK hynix Inc., Gyeonggi-do (KR)

(72) Inventor: Sang-Geun Bae, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 147 days.

(21) Appl. No.: 16/265,736

(22) Filed: Feb. 1, 2019

(65) Prior Publication Data

US 2020/0020362 A1    Jan. 16, 2020

(30) Foreign Application Priority Data

Jul. 11, 2018 (KR) .................. 10-2018-0080679

(51) Int. Cl.
*G11C 5/14* (2006.01)
*G06F 3/06* (2006.01)

(52) U.S. Cl.
CPC ............ *G11C 5/147* (2013.01); *G06F 3/0604* (2013.01); *G06F 3/0659* (2013.01); *G06F 3/0673* (2013.01)

(58) Field of Classification Search
CPC ..... G11C 5/147; G11C 29/021; G11C 29/028; G11C 7/08; G06F 3/0673; G06F 3/0659; G06F 3/0604
See application file for complete search history.

(56) References Cited

U.S. PATENT DOCUMENTS

| 2015/0066819 | A1* | 3/2015 | Mozak | G05B 13/02 706/12 |
| 2015/0333759 | A1* | 11/2015 | Jung | H03L 7/10 327/158 |
| 2015/0338863 | A1* | 11/2015 | Ikeda | G05F 1/575 365/226 |
| 2015/0364210 | A1* | 12/2015 | Kim | G11C 17/16 365/96 |
| 2016/0071616 | A1* | 3/2016 | Jeong | G11C 29/025 714/719 |
| 2016/0204699 | A1* | 7/2016 | Arakawa | H02M 3/156 327/536 |

(Continued)

FOREIGN PATENT DOCUMENTS

KR      100817080     3/2008
KR      1020150047290 5/2015

*Primary Examiner* — Charles Rones
*Assistant Examiner* — Tong B. Vo
(74) *Attorney, Agent, or Firm* — IP & T Group LLP (57) ABSTRACT

A memory system includes a memory device; and a memory controller including: a code signal generator configured to generate first code signals; a comparison voltage selector configured to select as a comparison voltage reference voltage candidates in order of a voltage level in response to the first code signals; a delay component configured to generate second code signals by delaying the first code signals; a reference voltage candidate selector configured to select as a reference voltage candidate the reference voltage candidates in the order of a voltage level in response to the second code signals; and a detector configured to generate a flag signal by comparing the comparison voltage and the reference voltage candidate alternately provided from the comparison voltage selector and the reference voltage candidate selector.

18 Claims, 7 Drawing Sheets

(56) References Cited

U.S. PATENT DOCUMENTS

| | | | |
|---|---|---|---|
| 2016/0372176 A1* | 12/2016 | Song | G11C 11/4076 |
| 2017/0287535 A1* | 10/2017 | Lee | G11C 29/028 |
| 2019/0147920 A1* | 5/2019 | Chyan | G11C 5/143 |
| | | | 365/189.09 |
| 2019/0164594 A1* | 5/2019 | Eom | G11C 11/4087 |
| 2019/0164596 A1* | 5/2019 | Lee | G11C 11/419 |
| 2019/0311773 A1* | 10/2019 | Jimenez-Olivares | G11C 29/021 |

* cited by examiner

MEMORY SYSTEM PERFORMING REFERENCE VOLTAGE TRAINING OPERATION AND OPERATING METHOD OF MEMORY SYSTEM

CROSS-REFERENCE TO RELATED APPLICATIONS

The present application claims priority under 35 U.S.C. § 119 to Korean Patent Application No. 10-2018-0080679, filed on Jul. 11, 2018, which is incorporated herein by reference in its entirety.

BACKGROUND

1. Field

Various exemplary embodiments of the present invention generally relate to a memory system. Particularly, to a memory system including a memory controller performing a reference voltage training operation and an operating method thereof.

2. Description of the Related Art

A memory system includes a memory device and a memory controller. The memory controller controls the memory device to perform a read operation of outputting read data in response to a read command. The memory controller may transfer the read data from the memory device to a host.

The memory controller uses various reference voltages for recognizing read data from the memory device. The memory controller determines a logic level of the read data using the reference voltages. The memory controller determines exact levels of the reference voltages through a reference voltage training operation.

During the reference voltage training operation, the memory controller determines a reference voltage candidate having an appropriate level, among reference voltage candidates having different levels, as the reference voltage by reading training data using the reference voltage candidates sequentially selected from the lowest level to the highest level.

The memory controller provides training data read commands respectively corresponding to the sequentially selected reference voltage candidates in order to determine logic levels of the training data read from the memory device using the sequentially selected reference voltage candidates.

According to the specification determined by a manufacturer of the memory system, the memory controller may wait for a fixed time duration before providing the memory device with the training data read commands during the reference voltage training operation. According to the specification determined by the manufacturer of the memory system, even when the memory controller already determines the reference voltage candidates and thus is ready to determine the logic levels of the training data to be provided from the memory device, the memory controller has to wait until the end of the fixed time duration to provide the memory device with the training data read commands. That is, the memory controller provides the memory device with the training data read commands respectively corresponding to the sequentially selected reference voltage candidates after the fixed time duration elapsed. Therefore, it is required to resolve the concern of the long time duration for the reference voltage training operation, which is defined by the specification regulated by the manufacturer of the memory system.

SUMMARY

Various embodiments of the present invention are directed to a memory system capable of reducing a time duration for a reference voltage training operation, and an operating method thereof.

In accordance with an embodiment of the present invention, a memory system may include a memory device; and a memory controller including: a code signal generator configured to sequentially generate first code signals; a comparison voltage selector configured to sequentially select as a comparison voltage reference voltage candidates in order of a voltage level in response to the first code signals; a delay component configured to generate second code signals by delaying the first code signals; a reference voltage candidate selector configured to sequentially select as a reference voltage candidate the reference voltage candidates in the order of a voltage level in response to the second code signals; and a detector configured to sequentially generate a flag signal by sequentially comparing the comparison voltage and the reference voltage candidate alternately provided from the comparison voltage selector and the reference voltage candidate selector.

In accordance with an embodiment of the present invention, an operating method of a memory system including a memory device and a memory controller, may include sequentially generating, by the memory controller, first code signals; sequentially selecting reference voltage candidates in order of a voltage level as a comparison voltage; generating, by the memory controller, second code signals by delaying the first code signals; selecting, by the memory controller, the reference voltage candidates in the order of a voltage level as a reference voltage candidate; and sequentially generating, by the memory controller, a flag signal by sequentially comparing the comparison voltage and the reference voltage candidate which are alternately provided.

In accordance with an embodiment of the present invention, the memory controller may sequentially generate flag signals by detecting time points of sequentially selecting the reference voltage candidates, and may provide the memory device with the read command of reading the training data in response to the sequentially generated flag signals even before the end of a fixed time duration to be waited for the memory controller to provide the memory device with the read command, which are defined by specifications regulated by a manufacturer of the memory system. Therefore, a memory system may reduce a time duration for a reference voltage training operation.

DETAILED DESCRIPTION

Various embodiments will be described below in more detail with reference to the accompanying drawings. The embodiments of the present invention may, however, be embodied in different forms and should not be construed as limited to the embodiments set forth herein. Rather, these embodiments are provided so that this disclosure will be thorough and complete and will fully convey the scope of the present invention to those skilled in the art. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

The drawings are not necessarily to scale and in some instances, proportions may have been exaggerated in order to clearly illustrate features of the embodiments. Throughout the disclosure, reference numerals correspond directly to the like parts in the various figures and embodiments of the present invention.

It is also noted that in this specification, "connected/coupled" refers to one component not only directly coupling another component but also indirectly coupling another component through an intermediate component.

In addition, a singular form may include a plural form and vice versa, as long as it is not specifically mentioned in a sentence.

Hereinafter, the various embodiments of the present invention will be described in detail with reference to the attached drawings.

Figure 1:
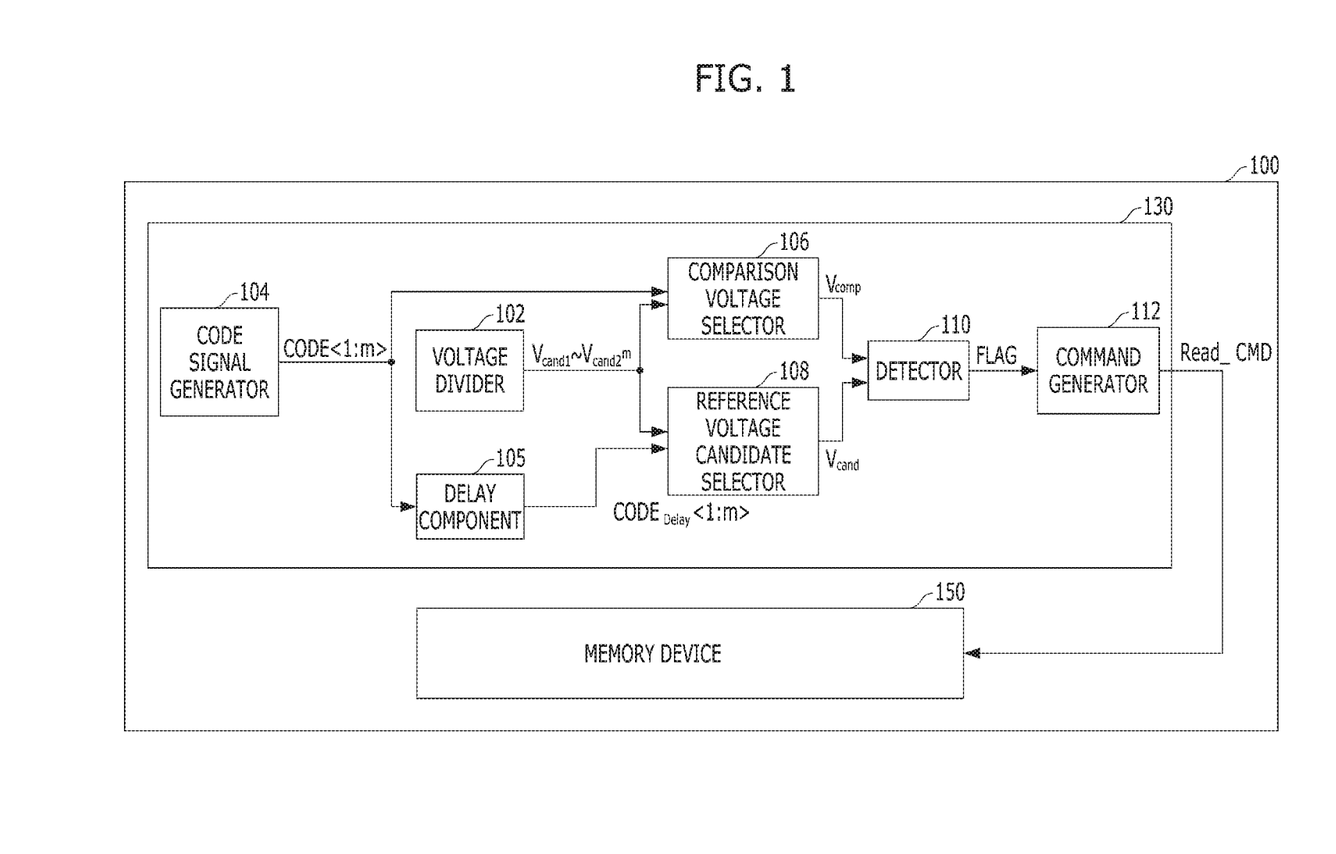
FIG. 1 is a block diagram schematically illustrating a memory system in accordance with an embodiment of the present invention.

FIG. 1 is a block diagram schematically illustrating a memory system 100 in accordance with an embodiment of the present invention.

Referring to FIG. 1, the memory system 100 may include a memory controller 130 and a memory device 150.

The memory controller 130 may include a voltage divider 102, a code signal generator 104, a delay component 105, a comparison voltage selector 106, a reference voltage candidate selector 108, a detector 110, and a command generator 112.

The voltage divider 102 may generate $2^m$ numbers of reference voltage candidates $V_{cand1}$ to $V_{cand2}{}^m$. The divider 102 may include a voltage divider circuit performing a voltage division operation. The voltage divider 102 may provide the generated reference voltage candidates $V_{cand1}$ to $V_{cand2}{}^m$ to the comparison voltage selector 106 and the reference voltage candidate selector 108.

The code signal generator 104 may sequentially generate first code signals CODE<1:m>. For example, the code signal generator 104 may sequentially generate the first code signals CODE<1:m> so that the comparison voltage selector 106 sequentially selects the $2^m$ numbers of reference voltage candidates $V_{cand1}$ to $V_{cand2}{}^m$ in ascending order of a voltage level as a comparison voltage $V_{comp}$. The code signal generator 104 may provide the sequentially generated first code signals CODE<1:m> to the comparison voltage selector 106 and the delay component 105. Meanwhile, the comparison voltage selector 106 sequentially selects the $2^m$ numbers of reference voltage candidates $V_{cand1}$ to $V_{cand2}{}^m$ in descending order of a voltage level.

The delay component 105 may sequentially generate second code signals $CODE_{Delay}$<1:m> by buffering the first code signals CODE<1:m>. The delay component 105 may sequentially generate the second code signals $CODE_{Delay}$<1:m> by delaying the first code signals CODE<1:m> so that the sequentially generated first code signals CODE<1:m> and the sequentially generated second code signals $CODE_{Delay}$<1:m> are alternately provided to the comparison voltage selector 106 and the reference voltage candidate selector 108, respectively. For example, the reference voltage candidate selector 108 may select a voltage having an i-th voltage level among the reference voltage candidates $V_{cand1}$ to $V_{cand2}{}^m$ as a reference voltage candidate $V_{cand}$ at a time point 't(i+1)' when the comparison voltage selector 106 selects a voltage having an i-th voltage level among the $2^m$ numbers of reference voltage candidates $V_{cand1}$ to $V_{cand2}{}^m$ as the comparison voltage $V_{comp}$ at a time point 't(i)'.

The comparison voltage selector 106 may sequentially select the $2^m$ numbers of reference voltage candidates $V_{cand1}$ to $V_{cand2}{}^m$ provided from the voltage divider 102 as the comparison voltage $V_{comp}$ to provide as the comparison voltage $V_{comp}$ to the detector 110, according to the first code signals CODE<1:m>.

Figure 2:
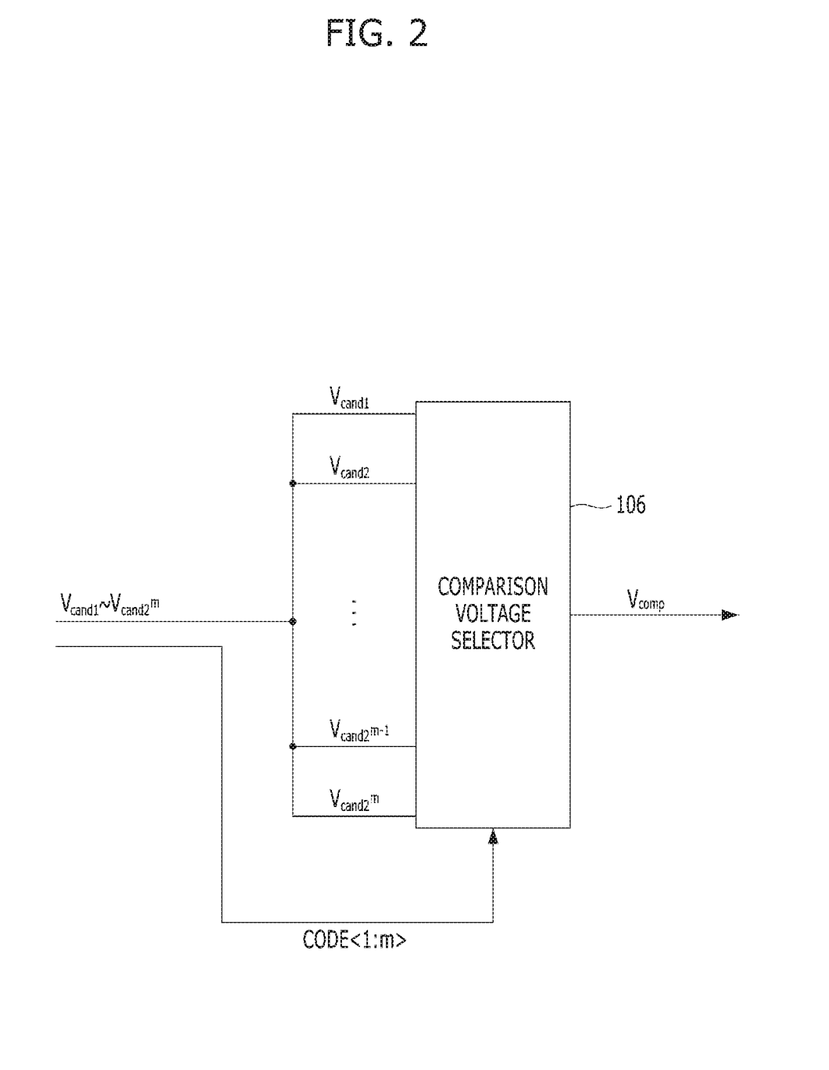
FIG. 2 is a detailed diagram of a comparison voltage selector shown in FIG. 1.

FIG. 2 is a detailed diagram of the comparison voltage selector 106 shown in FIG. 1.

Referring to FIG. 2, the comparison voltage selector 106 may include a multiplexer configured to output a single comparison voltage $V_{comp}$ among the $2^m$ numbers of reference voltage candidates $V_{cand1}$ to $V_{cand2}{}^m$ input thereto, according to the first code signals CODE<1:m>. The comparison voltage selector 106 may sequentially select the $2^m$ numbers of reference voltage candidates $V_{cand1}$ to $V_{cand2}{}^m$ in ascending order of a voltage level, as the comparison voltage $V_{comp}$ in response to the sequentially provided first code signals CODE<1:m>. Among the $2^m$ numbers of reference voltage candidates $V_{cand1}$ to $V_{cand2}{}^m$, the comparison voltage selector 106 may first select as the comparison voltage $V_{comp}$ the reference voltage candidate $V_{cand1}$ having the lowest voltage level; then intermediately select as the comparison voltage $V_{comp}$ the reference voltage candidate $V_{cand2}$ to $V_{cand(2^m-1)}$ in ascending order of a voltage level; and lastly select as the comparison voltage $V_{comp}$ the reference voltage candidate $V_{cand2}{}^m$ having the highest voltage level, according to the first code signals CODE<1:m>. The comparison voltage selector 106 may provide the reference voltage candidates $V_{cand1}$ to $V_{cand2}{}^m$ sequentially selected as the comparison voltage $V_{comp}$ to the detector 110.

Referring back to FIG. 1, the reference voltage candidate selector 108 may sequentially select the $2^m$ numbers of reference voltage candidates $V_{cand1}$ to $V_{cand2}{}^m$ provided from the voltage divider 102 to provide as the reference voltage candidate $V_{cand}$ to the detector 110, according to the second code signals $CODE_{Delay}<1:m>$.

Figure 3:
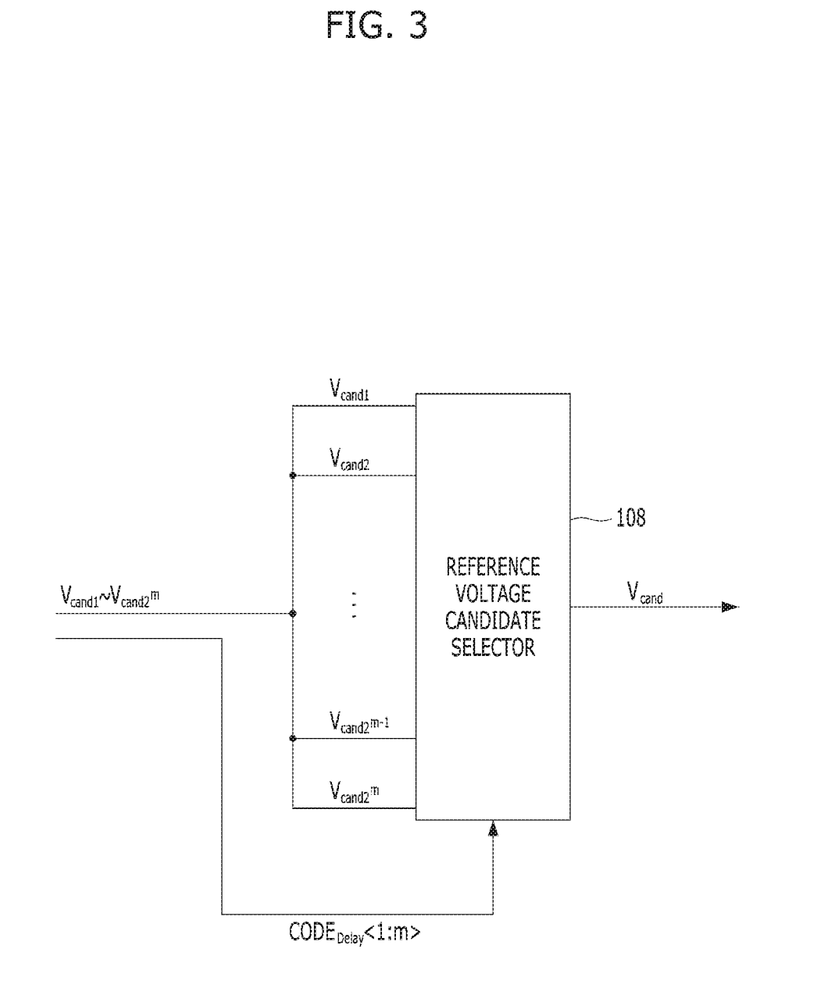
FIG. 3 is a detailed diagram of a reference voltage candidate selector shown in FIG. 1.

FIG. 3 is a detailed diagram of the reference voltage candidate selector 108.

Referring to FIG. 3, the reference voltage candidate selector 108 may include a multiplexer configured to output a single reference voltage candidate $V_{cand}$ among the $2^m$ numbers of reference voltage candidates $V_{cand1}$ to $V_{cand2}{}^m$ input thereto, according to the second code signals $CODE_{Delay}<1:m>$. The reference voltage candidate selector 108 may sequentially select the $2^m$ numbers of reference voltage candidates $V_{cand1}$ to $V_{cand2}{}^m$ in ascending order of a voltage level, as the reference voltage candidate $V_{cand}$ in response to the sequentially provided second code signals $CODE_{Delay}<1:m>$.

As described above, the comparison voltage selector 106 and the reference voltage candidate selector 108 may generate the comparison voltage $V_{comp}$ and the reference voltage candidate $V_{cand}$, respectively, by sequentially selecting the $2^m$ numbers of reference voltage candidates $V_{cand1}$ to $V_{cand2}{}^m$ provided from the voltage divider 102 in ascending order of a voltage level, and provide the selected comparison voltage $V_{comp}$ and the selected reference voltage candidate $V_{cand}$ to the detector 110, respectively.

The comparison voltage selector 106 and the reference voltage candidate selector 108 may alternately provide the selected comparison voltage $V_{comp}$ and the selected reference voltage candidate $V_{cand}$ to the detector 110.

In order to alternately provide the comparison voltage $V_{comp}$ and the selected reference voltage candidate $V_{cand}$ to the detector 110, the code signal generator 104 and the delay component 105 may provide the comparison voltage selector 106 and the reference voltage candidate selector 108 alternately with the first code signals $CODE<1:m>$ and the second code signals $CODE_{Delay}<1:m>$ for selecting a voltage having an i-th voltage level among the $2^m$ numbers of reference voltage candidates $V_{cand1}$ to $V_{cand2}{}^m$ as the reference voltage candidate $V_{cand}$. The comparison voltage selector 106 and the reference voltage candidate selector 108 may alternately select the voltage having an i-th voltage level among the $2^m$ numbers of reference voltage candidates $V_{cand1}$ to $V_{cand2}{}^m$ in response to the first code signals $CODE<1:m>$ and the second code signals $CODE_{Delay}<1:m>$, which are alternately provided, to provide as the comparison voltage $V_{comp}$ and the reference voltage candidate $V_{cand}$ to the detector 110.

Referring back to FIG. 1, the detector 110 may sequentially generate a flag signal FLAG by sequentially comparing the comparison voltage $V_{comp}$ and the reference voltage candidate $V_{cand}$ provided from the comparison voltage selector 106 and the reference voltage candidate selector 108. The detector 110 may generate the flag signal FLAG in response to the comparison voltage $V_{comp}$ and the reference voltage candidate $V_{cand}$ both having an i-th voltage level among the $2^m$ numbers of reference voltage candidates $V_{cand1}$ to $V_{cand2}{}^m$.

For example, when the comparison voltage selector 106 provides the detector 110 with a voltage having an i-th voltage level among the $2^m$ numbers of reference voltage candidates $V_{cand1}$ to $V_{cand2}{}^m$ as the comparison voltage $V_{comp}$ at a time point 't(i)', the detector 110 may compare the provided comparison voltage $V_{comp}$ having the i-th voltage level with the reference voltage candidate $V_{cand}$ having an (i−1)th voltage level, which is provided from the reference voltage candidate selector 108 at a time point 't(i−1)' before the time point 't(i)'. As a result of the comparison, the comparison voltage $V_{comp}$ having the i-th voltage level may have the different voltage level from the reference voltage candidate $V_{cand}$ having an (i−1)th voltage level, and thus the detector 110 may deactivate the flag signal FLAG.

After that, when the reference voltage candidate selector 108 provides the detector 110 with a voltage having an (i+1)th voltage level among the $2^m$ numbers of reference voltage candidates $V_{cand1}$ to $V_{cand2}{}^m$ as the reference voltage candidate $V_{cand}$ at a time point 't(i+1)', the detector 110 may compare the provided reference voltage candidate $V_{cand}$ having the (i+1)th voltage level with the comparison voltage $V_{comp}$ having the (i+1)th voltage level, which is provided from the comparison voltage selector 106 at a time point 't(i)' before the time point 't(i+1)'. As a result of the comparison, the comparison voltage $V_{comp}$ having the (i+1)th voltage level may have the same voltage level as the reference voltage candidate $V_{cand}$ having an (i+1)th voltage level, and thus the detector 110 may activate the flag signal FLAG.

As described above, the comparison voltage selector 106 and the reference voltage candidate selector 108 may sequentially provide the detector 110 with the comparison voltage $V_{comp}$ and the reference voltage candidate $V_{cand}$, and thus the detector 110 may generate the flag signal FLAG. The detector 110 may provide the generated flag signal FLAG to the command generator 112.

Figure 4:
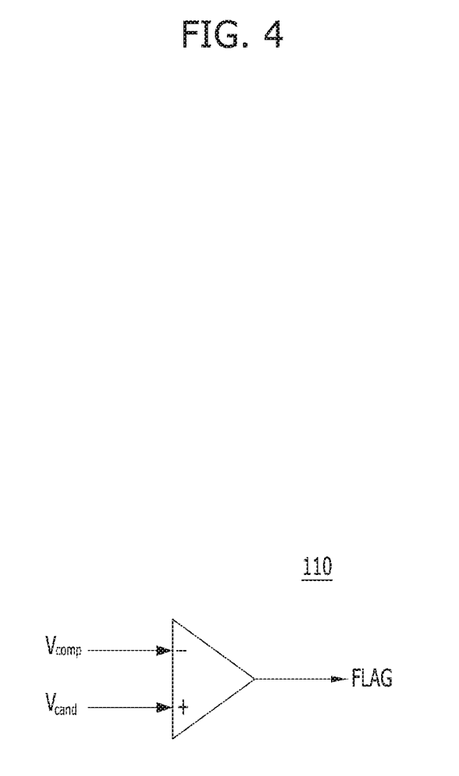
FIG. 4 is a detailed diagram of a detector shown in FIG. 1.

FIG. 4 is a detailed diagram of the detector 110 shown in FIG. 1.

Referring to FIG. 4, the detector 110 may include a comparator configured to output the flag signal FLAG at a logic low level or a logic high level by comparing the comparison voltage $V_{comp}$ and the reference voltage candidate $V_{cand}$. In accordance with an embodiment of the present invention, the comparator included in the detector 110 may be implemented with a miss-match operational amplifier (OP Amp) configured to output a signal having a logic high level even when input signals respectively provided to negative and positive input terminals thereof are identical to each other. The detector 110 may receive at its negative input terminal the comparison voltage $V_{comp}$ sequentially provided from the comparison voltage selector 106 and may receive at its positive input terminal the reference voltage candidate $V_{cand}$ alternately and sequentially provided from the reference voltage candidate selector 108.

The detector 110 may output the flag signal FLAG having a logic high level when the voltage level of the comparison voltage $V_{comp}$ sequentially provided into the negative input terminal is the same as the voltage level of the reference voltage candidate $V_{cand}$ sequentially provided into the positive input terminal. The sequentially provided comparison voltage $V_{comp}$ and the sequentially provided reference voltage candidate $V_{cand}$ may be inputted with a time gap to the negative and positive input terminals.

As described above, the comparison voltage selector 106 and the reference voltage candidate selector 108 may sequentially provide the detector 110 with the comparison voltage $V_{comp}$ and the reference voltage candidate $V_{cand}$ with a time gap.

For example, the comparison voltage selector 106 may select a voltage having an (i+1)th voltage level as the comparison voltage $V_{comp(i+1)}$ among the $2^m$ numbers of reference voltage candidates $V_{cand1}$ to $V_{cand2}{}^m$ according to the first code signals $CODE<1:m>$, and after that the reference voltage candidate selector 108 may select the voltage having the (i+1)th voltage level as the reference voltage candidate $V_{cand(i+1)}$ among the $2^m$ numbers of reference voltage candidates $V_{cand1}$ to $V_{cand2}{}^m$ according to the second code signals $CODE_{Delay}<1:m>$.

Therefore, the detector 110 may alternately receive the comparison voltage $V_{comp(i+1)}$ having the (i+1)th voltage level and the reference voltage candidate $V_{cand(i+1)}$ having the (i+1)th voltage level. Accordingly, the detector 110 may receive the reference voltage candidate $V_{cand(i+1)}$ having the (i+1)th voltage level in a state where the comparison voltage $V_{comp(i+1)}$ having the (i+1)th voltage level has already received. Eventually, the comparison voltage $V_{comp}$ and the reference voltage candidate $V_{cand}$ sequentially provided to the detector 110 may have different voltage levels at a particular time point, but may have the same voltage level as each other at the following time point.

For example, the detector 110 may deactivate the flag signal FLAG at a particular time point since, at that time point, the received comparison voltage $V_{comp(i+1)}$ having the (i+1)th voltage level provided to the negative input terminal and the reference voltage candidate $V_{candi}$ having the i-th voltage level provided to the positive input terminal have different levels from each other.

At the following time point, the detector 110 may receive, when the reference voltage candidate selector 108 selects as the reference voltage candidate $V_{cand(i+1)}$ a voltage having the (i+1)th voltage level among the $2^m$ numbers of reference voltage candidates $V_{cand1}$ to $V_{cand2}{}^m$, the reference voltage candidate $V_{cand(i+1)}$ having the (i+1)th voltage level at the positive input terminal.

At this time point, the detector 110 may activate the flag signal FLAG at a logic high level since, at this time point, the comparison voltage $V_{comp(i+1)}$ having the (i+1)th voltage level provided to the negative input terminal and the reference voltage candidate $V_{cand(i+1)}$ having the (i+1)th voltage level provided to the positive input terminal are identical to each other.

Figure 5:
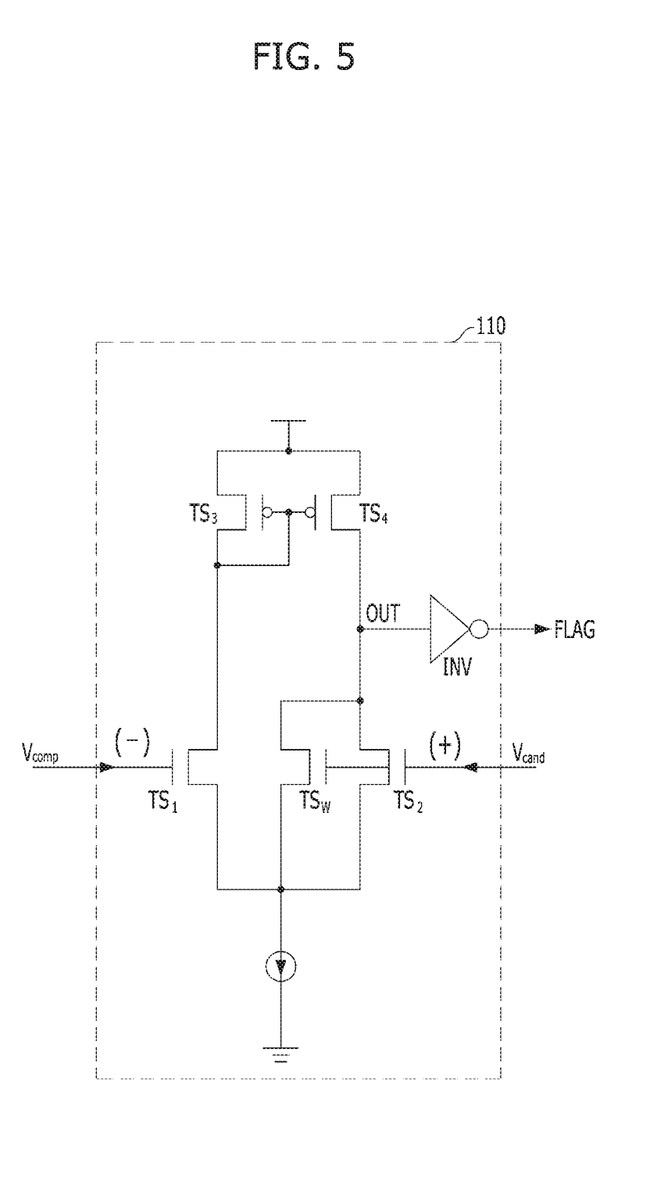
FIG. 5 is a circuit diagram of the detector shown in FIG. 4.

FIG. 5 is a circuit diagram of the detector 110 shown in FIG. 1. In an embodiment such as the one shown in FIG. 5, the detector 110 may be implemented with a mismatch OP Amp.

The mismatch OP Amp may include a positive input terminal (+), a negative input terminal (−), an output terminal OUT, a ground input terminal, a first NMOS transistor TS1, a second NMOS transistor TS2, a weighted transistor TSw, a first PMOS transistor TS3, a second PMOS transistor TS4, a current source, and an inverter INV. The first and second PMOS transistors TS3 and TS4 may form a current mirror, and the current source may be implemented with an NMOS transistor.

The mismatch OP Amp may receive the comparison voltage $V_{comp}$ at the negative input terminal and receive the reference voltage candidate $V_{cand}$ at the positive input terminal. In the mismatch OP Amp, the first NMOS transistor TS1 may be coupled to the negative input terminal, and the second NMOS transistor TS2 and the weighted transistor TSw may be coupled in parallel to the positive input terminal. When receiving voltages (i.e., $V_{cand}$ and $V_{comp}$) having the same voltage level at both of the negative input terminal and the positive input terminal, the mismatch OP Amp may determine the voltage (i.e., $V_{cand}$) provided to the positive input terminal as greater than the voltage (i.e., $V_{comp}$) provided to the negative input terminal due to the weighted transistor TSw coupled to the positive input terminal. In this case, more sinking current may flow through the second NMOS transistor TS2 and the weighted transistor TSw to the ground terminal. Accordingly, the output terminal OUT may have a lower voltage level, and thus the inverter INV may output the flag signal FLAG having a logic high level.

Referring back to FIG. 1, the command generator 112 may sequentially provide a training data read command Read_CMD to the memory device 150 in response to the flag signal FLAG provided from the detector 110.

In general, the command generator 112 provides the training data read command Read_CMD to the memory device 150 after a fixed time elapses, which is defined by the specification determined by a manufacturer of the memory system, even when the command generator 112 is ready to provide the training data read command Read_CMD to the memory device 150 before the elapse of the fixed time duration.

Therefore, a standby time duration Tdelay occurs, which corresponds to discrepancy (i.e. Tspec−Tcand) between a time duration Tcand for the reference voltage candidate selector 108 to select the reference voltage candidate $V_{cand}$ and the fixed time duration Tspec defined by the specifications determined by the manufacturer of the memory system. There may occur $2^m$ number of times of the standby time duration Tdelay during the reference voltage training operation of the memory controller 130 since the reference voltage candidate selector 108 sequentially selects as the reference voltage candidate $V_{cand}$ $2^m$ number of times from the $2^m$ numbers of reference voltage candidates $V_{cand1}$ to $V_{cand2}{}^m$ according to the sequentially provided second code signals $CODE_{Delay}$<1:m>, which causes increase of operation time of the reference voltage training operation.

In accordance with an embodiment of the present invention, the detector 110 may output the flag signal FLAG whenever the reference voltage candidate selector 108 sequentially selects the $2^m$ numbers of reference voltage candidates $V_{cand1}$ to $V_{cand2}{}^m$ as the reference voltage candidate $V_{cand}$ according to the sequentially provided second code signals $CODE_{Delay}$<1:m>. The command generator 112 may provide the training data read command Read_CMD to the memory device 150 in response to the flag signal FLAG thereby preventing the standby time duration Tdelay, and thus reducing the operation time of the reference voltage training operation of the memory controller 130.

Figure 6:
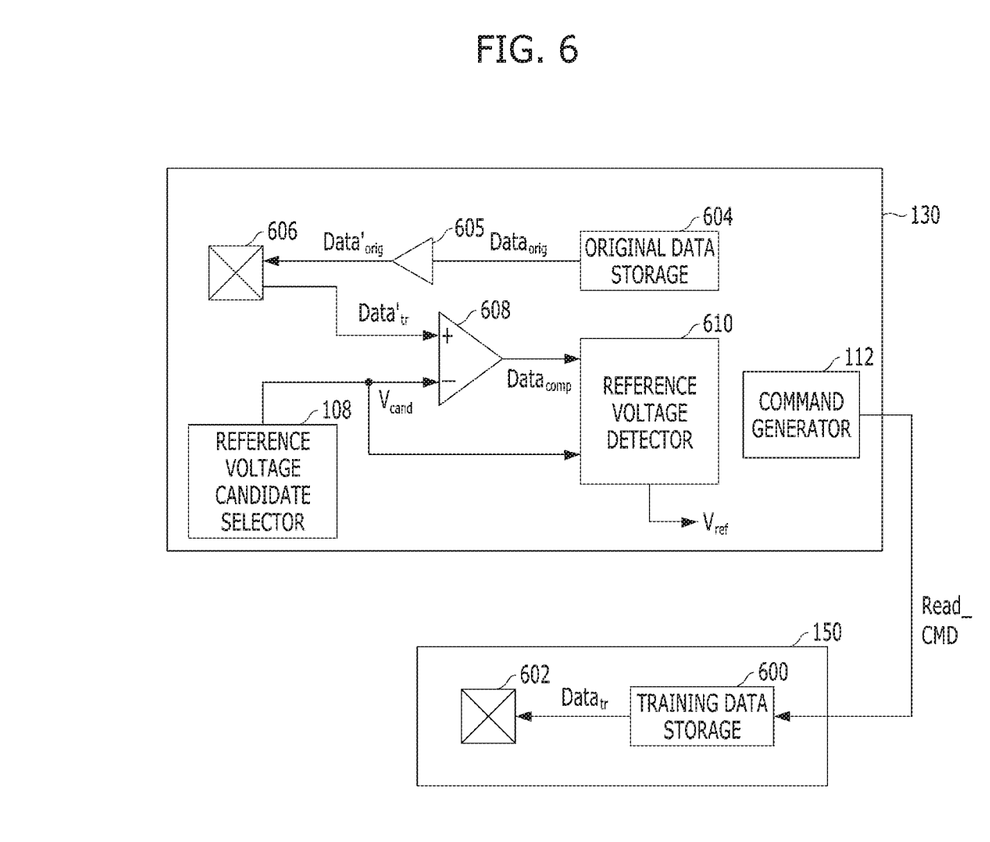
FIG. 6 is a block diagram schematically illustrating a memory system in accordance with an embodiment of the present invention.

FIG. 6 is a block diagram schematically illustrating the memory system 100 in accordance with an embodiment of the present invention. For conciseness and ease of description, FIG. 6 only illustrates some elements or components of the memory system 100 related to an embodiment of the present invention.

Referring to FIG. 6, the memory controller 130 may further include an original data storage 604, an output buffer 605, a controller DQ pad 606, a comparison data generator 608 and a reference voltage detector 610. The memory device 150 may further include a training data storage 600 and a memory DQ pad 602. The memory device 150 may include a plurality of memory cells, which may be DRAM memory cells.

The memory device 150 may sequentially read training data $Data_{tr}$ stored in the training data storage 600 in response to the training data read command Read_CMD sequentially provided from the command generator 112 of the memory controller 130. In accordance with an embodiment of the present invention, the training data $Data_{tr}$ may be generated through a write training operation by providing the memory device 150 with original data $Data_{orig}$ stored in the original data storage 604 through the output buffer 605.

The memory device 150 may provide the memory DQ pad 602 with the sequentially read training data $Data_{tr}$, and the training data $Data'_{tr}$ may be input to the positive input terminal of the comparison data generator 608 through the controller DQ pad 606. In accordance with an embodiment of the present invention, when the controller 130 is coupled to a plurality of the memory devices 150, a plurality of controller DQ pads 606 and a plurality of memory DQ pads 602 may be provided.

The reference voltage candidate selector 108 may sequentially select the $2^m$ numbers of reference voltage candidates $V_{cand1}$ to $V_{cand2}^m$ provided from the voltage divider 102 in ascending order of a voltage level to generate the reference voltage candidate $V_{cand}$ and may provide the generated reference voltage candidate $V_{cand}$ to the negative input terminal of the comparison data generator 608.

The comparison data generator 608 may sequentially generate comparison data $Data_{comp}$ by sequentially comparing the voltage levels of the training data $Data'_{tr}$ sequentially read from the memory device 150 with the reference voltage candidate $V_{cand}$ sequentially provided from the reference voltage candidate selector 108. The comparison data generator 608 may generate the comparison data $Data_{comp}$ having a logic high level when the voltage level of the training data $Data'_{tr}$ is greater than the voltage level of the reference voltage candidate $V_{cand}$, and having a logic low level when the voltage level of the training data $Data'_{tr}$ is less than the voltage level of the reference voltage candidate $V_{cand}$. The comparison data generator 608 may provide the reference voltage detector 610 with the sequentially generated comparison data $Data_{comp}$.

The reference voltage detector 610 may sequentially determine whether the original data $Data_{orig}$ stored in the original data storage 604 is the same as the comparison data $Data_{comp}$ sequentially provided from the comparison data generator 608. The original data $Data_{orig}$ may be the one provided to the memory device 150 by the memory controller 130 in order for the memory device 150 to perform a write training operation before the memory controller 130 performs a reference voltage read training operation.

The reference voltage detector 610 may detect, when the original data $Data_{orig}$ and the comparison data $Data_{comp}$ are identical to each other, the corresponding reference voltage candidate $V_{cand}$ as a reference voltage $V_{ref}$.

The memory controller 130 may detect the reference voltage $V_{ref}$ from the $2^m$ numbers of reference voltage candidates $V_{cand1}$ to $V_{cand2}^m$ by repeating the above-described operation for the $2^m$ numbers of reference voltage candidates $V_{cand1}$ to $V_{cand2}^m$.

Figure 7:
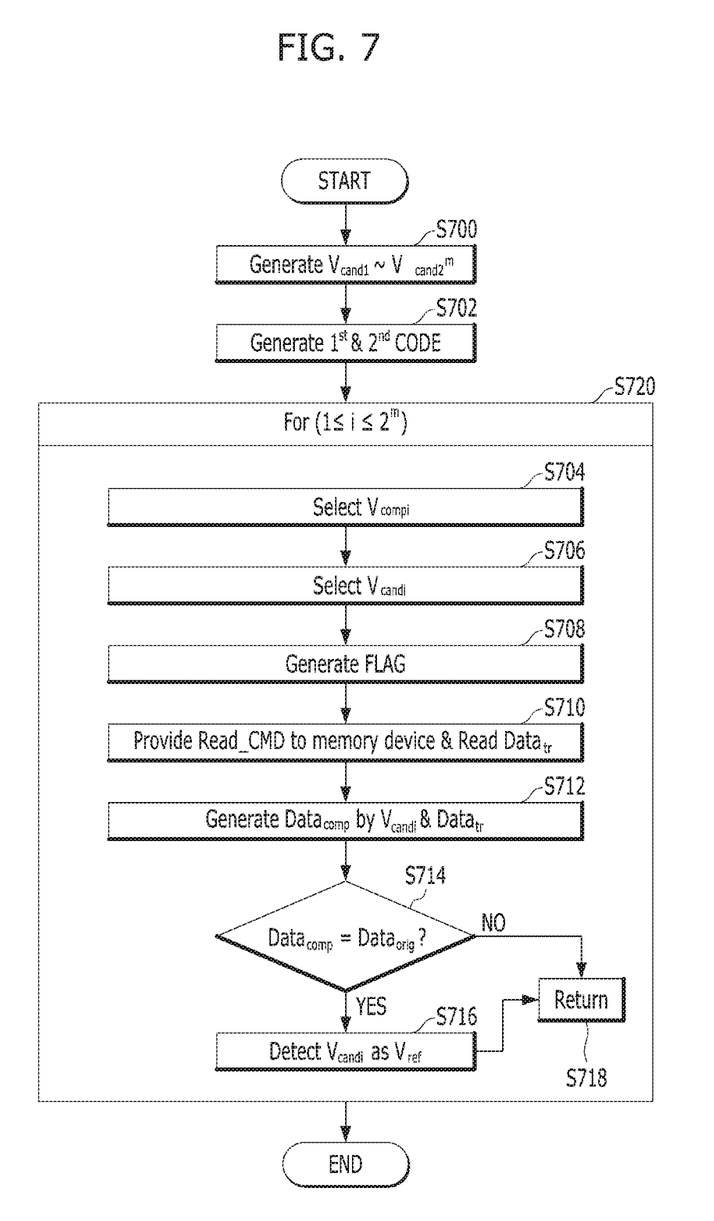
FIG. 7 is a flowchart schematically illustrating a reference voltage training operation of a memory system in accordance with an embodiment of the present invention.

FIG. 7 is a flowchart schematically illustrating a reference voltage training operation of the memory system 100 in accordance with an embodiment of the present invention. The reference voltage training operation of the memory system 100 will be described as below, by referring to shown in FIGS. 1, 6, and 7.

At step S700, the voltage divider 102 may generate $2^m$ numbers of reference voltage candidates $V_{cand1}$ to $V_{cand2}^m$ by performing a voltage division operation. The voltage divider 102 may provide the generated reference voltage candidates $V_{cand1}$ to $V_{cand2}^m$ to the comparison voltage selector 106 and the reference voltage candidate selector 108.

At step S702, the code signal generator 104 may sequentially generate $2^m$ numbers of first code signals CODE<1:m>. For example, the code signal generator 104 may sequentially generate the first code signals CODE<1:m> so that the comparison voltage selector 106 selects a comparison voltage $V_{compi}$ among the $2^m$ numbers of reference voltage candidates $V_{cand1}$ to $V_{cand2}^m$ in ascending order of a voltage level. The code signal generator 104 may provide the sequentially generated first code signals CODE<1:m> to the comparison voltage selector 106 and the delay component 105.

The delay component 105 may sequentially generate the second code signals $CODE_{Delay}$<1:m> by buffering the first code signals CODE<1:m>. The delay component 105 may sequentially generate second code signals $CODE_{Delay}$<1:m> by delaying the first code signals CODE<1:m> so that the sequentially generated first code signals CODE<1:m> and the sequentially generated second code signals $CODE_{Delay}$<1:m> are alternately provided to the comparison voltage selector 106 and the reference voltage candidate selector 108, respectively. For example, the delay component 105 may generate the second code signals $CODE_{Delay}$<1:m> such that the reference voltage candidate selector 108 selects as a reference voltage candidate $V_{candi}$ a voltage having an i-th voltage level among the reference voltage candidates $V_{cand1}$ to $V_{cand2}^m$ at a time point 't(i+1)' when the comparison voltage selector 106 selects as the comparison voltage $V_{compi}$ a voltage having an i-th voltage level among the $2^m$ numbers of reference voltage candidates $V_{cand1}$ to $V_{cand2}^m$ at a time point 't(i)'.

At step S704, the comparison voltage selector 106 may sequentially select the comparison voltage $V_{compi}$ among the $2^m$ numbers of reference voltage candidates $V_{cand1}$ to $V_{cand2}^m$ provided from the voltage divider 102 and may provide the sequentially selected comparison voltage $V_{compi}$ to the detector 110, according to the first code signals CODE<1:m> provided at step S702.

At step S706, the reference voltage candidate selector 108 may sequentially select the reference voltage candidate $V_{candi}$ among the $2^m$ numbers of reference voltage candidates $V_{cand1}$ to $V_{cand2}^m$ provided from the voltage divider 102 and may provide the sequentially selected reference voltage candidate $V_{candi}$ to the detector 110, according to the second code signals $CODE_{Delay}$<1:m> provided at step S702.

At step S708, the detector 110 may sequentially generate the flag signal FLAG by sequentially comparing the comparison voltage $V_{compi}$ and the reference voltage candidate $V_{candi}$, which are alternately provided from the comparison voltage selector 106 and the reference voltage candidate selector 108. The detector 110 may generate the flag signal FLAG in response to the comparison voltage $V_{compi}$ and the reference voltage candidate $V_{candi}$ both having an i-th voltage level, which are alternately provided from the comparison voltage selector 106 and the reference voltage candidate selector 108.

At step S710, the command generator 112 may sequentially provide a training data read command Read_CMD to the memory device 150 in response to the flag signal FLAG provided from the detector 110. The memory device 150 may sequentially read training data $Data_{tr}$ stored in the training data storage 600 in response to the training data read command Read_CMD sequentially provided from the command generator 112.

At step S712, the comparison data generator 608 may sequentially generate the comparison data $Data_{comp}$ by sequentially comparing the voltage levels of the training data $Data_{tr}$ sequentially read from the memory device 150 at step S710 with the reference voltage candidate $V_{candi}$ sequentially provided from the reference voltage candidate selector 108 at step S706.

At step S714, the reference voltage detector 610 may sequentially determine whether the original data $Data_{orig}$ stored in the original data storage 604 is same as the comparison data $Data_{comp}$ sequentially generated from the comparison data generator 608 at step S712. When the original data Data$_{orig}$ and the comparison data Data$_{comp}$ are determined to be identical to each other ('YES' at step S714), the reference voltage detector 610 may detect the reference voltage candidate V$_{candi}$ having the i-th voltage level selected at step S706 as the reference voltage V$_{ref}$ at step S716. When the reference voltage V$_{ref}$ is selected and when the original data Data$_{orig}$ and the comparison data Data$_{comp}$ are determined as different from each other ('NO' at step S714), step S720 may be repeated again with increased the index 'i' at step S718.

At step S720, the memory controller 130 may perform the reference voltage training operation by repeating steps S704 to S718 until the index 'i' reaches the value of $2^m$.

According to the embodiment of the present invention, a memory system may reduce a time duration for a reference voltage training operation.

While the present invention has been described with respect to the specific embodiments, it will be apparent to those skilled in the art that various changes and modifications may be made without departing from the spirit and scope of the invention as defined in the following claims.

What is claimed is:

1. An operating method of a memory system including a memory device and a memory controller, the operating method comprising:
generating, by a code signal generator included in the memory controller, first code signals;
selecting, by a comparison voltage selector included in the memory controller, reference voltage candidates in an order of a voltage level as a comparison voltage;
generating, by a delay component included in the memory controller, second code signals by delaying the first code signals from the code signal generator;
selecting, by a reference voltage candidate selector included in the memory controller, the reference voltage candidates in the order of a voltage level as a reference voltage candidate; and
generating, by a detector included in the memory controller, a flag signal by comparing the comparison voltage and the reference voltage candidate which are alternately provided,
wherein each one of the first code signals from the code signal generator is provided to both the comparison voltage selector and the delay component,
wherein the detector comprises a mismatch operational amplifier (OP Amp) including a first input transistor receiving the comparison voltage, a second input transistor receiving the reference voltage candidate, and a weighted input transistor receiving the reference voltage candidate and coupled in parallel to the second input transistor, and
wherein the detector generates the flag signal having a first logic level when the comparison voltage equals to the reference voltage candidate and generates the flag signal having a second logic level when the comparison voltage does not equal to the reference voltage candidate.

2. The operating method of claim 1, further comprising performing, by a voltage divider included in the memory controller, a voltage division operation to generate the reference voltage candidates.

3. The operating method of claim 1, wherein the reference voltage candidates are selected in an ascending order of a voltage level.

4. The operating method of claim 1, wherein the comparison voltage and the reference voltage candidate are alternately selected by a same reference voltage candidate among the reference voltage candidates.

5. The operating method of claim 1, further comprising sequentially providing, by a command generator included in the memory controller, a training data read command to the memory device in response to the flag signal.

6. The operating method of claim 5, further comprising sequentially reading, by the memory device, training data in response to the training data read command.

7. The operating method of claim 6, further comprising sequentially generating, by a comparison data generator included in the memory controller, comparison data by comparing voltage levels of the sequentially read training data and the sequentially selected reference voltage candidate.

8. The operating method of claim 7, wherein the comparison data has a first logic level when a voltage level of the training data is greater than a voltage level of the reference voltage candidate, and has a second logic level when the voltage level of the training data is less than the voltage level of the reference voltage candidate.

9. The operating method of claim 7, further comprising detecting, by a reference voltage detector included in the memory controller, when the sequentially generated comparison data and original data are identical to each other, the sequentially selected reference voltage candidate as a reference voltage.

10. A memory system comprising:
a memory device; and
a memory controller including:
a code signal generator configured to generate first code signals;
a comparison voltage selector configured to select as a comparison voltage reference voltage candidates in an order of a voltage level in response to the first code signals from the code signal generator;
a delay component configured to generate second code signals by delaying the first code signals from the code signal generator;
a reference voltage candidate selector configured to select as a reference voltage candidate the reference voltage candidates in the order of a voltage level in response to the second code signals; and
a detector configured to generate a flag signal by comparing the comparison voltage and the reference voltage candidate alternately provided from the comparison voltage selector and the reference voltage candidate selector,
wherein each one of the first code signals from the code signal generator is provided to both the comparison voltage selector and the delay component,
wherein the detector comprises a mismatch operational amplifier (OP Amp) including a first input transistor receiving the comparison voltage, a second input transistor receiving the reference voltage candidate, and a weighted input transistor receiving the reference voltage candidate and coupled in parallel to the second input transistor, and
wherein the detector generates the flag signal having a first logic level when the comparison voltage equals to the reference voltage candidate and generates the flag signal having a second logic level when the comparison voltage does not equal to the reference voltage candidate.

11. The memory system of claim 10, further comprising a voltage divider configured to generate the reference voltage candidates through a voltage division operation.

12. The memory system of claim 10, wherein the reference voltage candidates are selected in an ascending order of a voltage level.

13. The memory system of claim 10, wherein the comparison voltage selector and the reference voltage candidate selector alternately select a same reference voltage candidate among the reference voltage candidates.

14. The memory system of claim 10, further comprising a command generator configured to sequentially provide a training data read command to the memory device in response to the flag signal.

15. The memory system of claim 14, wherein the memory device sequentially reads training data in response to the training data read command.

16. The memory system of claim 15, the memory controller further comprises a comparison data generator configured to sequentially generate comparison data by comparing voltage levels of the sequentially read training data and the sequentially selected reference voltage candidate.

17. The memory system of claim 16, wherein the comparison data generator outputs the comparison data having a first logic level when a voltage level of the training data is greater than a voltage level of the reference voltage candidate, and having a second logic level when the voltage level of the training data is less than the voltage level of the reference voltage candidate.

18. The memory system of claim 16, further comprising a reference voltage detector configured to detect, when the sequentially generated comparison data and original data are identical to each other, the sequentially selected reference voltage candidate as a reference voltage.

* * * * *